United States Patent
Windisch

(10) Patent No.: US 9,209,365 B2
(45) Date of Patent: Dec. 8, 2015

(54) LIGHT-EMITTING DIODE MODULE AND METHOD FOR OPERATING A LIGHT-EMITTING DIODE MODULE

(71) Applicant: OSRAM GmbH, Munich (DE)

(72) Inventor: Reiner Windisch, Pettendorf (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 14/355,234

(22) PCT Filed: Oct. 15, 2012

(86) PCT No.: PCT/EP2012/070388
§ 371 (c)(1),
(2) Date: Apr. 30, 2014

(87) PCT Pub. No.: WO2013/064361
PCT Pub. Date: May 10, 2013

(65) Prior Publication Data
US 2014/0285088 A1  Sep. 25, 2014

(30) Foreign Application Priority Data
Nov. 3, 2011  (DE) .......................... 10 2011 085 645

(51) Int. Cl.
*H01J 1/62* (2006.01)
*H01J 63/04* (2006.01)
(Continued)

(52) U.S. Cl.
CPC .......... *H01L 33/504* (2013.01); *H01L 25/0753* (2013.01); *H01L 27/15* (2013.01);
(Continued)

(58) Field of Classification Search
CPC ... H01L 33/504; H01L 33/58; H01L 33/0866; H01L 27/15; H01L 25/0753; H01L 2924/0002; H01L 2933/0091; H05B 33/0866

USPC .......... 313/498, 500, 501, 502, 503, 506, 512
See application file for complete search history.

(56) References Cited

U.S. PATENT DOCUMENTS 7,391,046 B2   6/2008   Tsutsumi et al.
7,410,305 B2   8/2008   Ohe et al.
(Continued)

FOREIGN PATENT DOCUMENTS

DE   102005013785 A1   11/2005
DE   102005044396 A1   4/2006
(Continued)

OTHER PUBLICATIONS

International Search Report issued in the corresponding PCT application No. PCT/EP2012/070388, dated Jan. 22, 2013.

*Primary Examiner* — Thomas A Hollweg
*Assistant Examiner* — Kevin Quarterman

(57) ABSTRACT

A light-emitting diode module includes: at least one first light-emitting diode chip which is based on the material system AlInGaN and which emits a first radiation in the blue spectral range, at least one second light-emitting diode chip which is based on the material system InGaAlP and which emits a second radiation in the red spectral range, and a conversion element, which is disposed downstream of at least the first light-emitting diode chip and is designed for converting part of the first radiation into a third radiation in the green to green-yellow spectral range, wherein the conversion element comprises a first phosphor and a second phosphor, the first phosphor emits at a shorter wavelength than the second phosphor, the first phosphor has an absorption that decreases toward relatively long wavelengths in the long-wave blue spectral range, and the second phosphor has an absorption maximum in the middle blue spectral range.

16 Claims, 4 Drawing Sheets

(51) Int. Cl.
  *H01L 33/50* (2010.01)
  *H01L 25/075* (2006.01)
  *H01L 27/15* (2006.01)
  *H01L 33/58* (2010.01)
  *H05B 33/08* (2006.01)

(52) U.S. Cl.
  CPC ........... *H01L 33/58* (2013.01); *H05B 33/0866* (2013.01); *H01L 2924/0002* (2013.01); *H01L 2933/0091* (2013.01)

(56) References Cited

U.S. PATENT DOCUMENTS

| | | | |
|---|---|---|---|
| 8,410,507 B2 | 4/2013 | Stauss et al. | |
| 2004/0217364 A1 | 11/2004 | Tarsa et al. | |
| 2006/0060882 A1* | 3/2006 | Ohe et al. | 257/100 |
| 2007/0223219 A1 | 9/2007 | Medendorp, Jr. et al. | |
| 2007/0284994 A1 | 12/2007 | Morimoto et al. | |
| 2008/0079015 A1 | 4/2008 | Krummacher | |
| 2009/0095966 A1 | 4/2009 | Keller et al. | |
| 2009/0243457 A1 | 10/2009 | Jung et al. | |
| 2009/0256166 A1 | 10/2009 | Koike et al. | |
| 2009/0272996 A1* | 11/2009 | Chakraborty | 257/98 |
| 2010/0025709 A1* | 2/2010 | Koseki et al. | 257/98 |
| 2010/0193806 A1* | 8/2010 | Byun | 257/88 |
| 2011/0233168 A1 | 9/2011 | Krummaher | |
| 2012/0087105 A1* | 4/2012 | Dai et al. | 362/84 |
| 2012/0098015 A1* | 4/2012 | Krauter | 257/98 |
| 2012/0126275 A1 | 5/2012 | Eisert | |
| 2012/0146078 A1 | 6/2012 | Baumann et al. | |
| 2013/0293097 A1* | 11/2013 | Bergenek et al. | 313/512 |

FOREIGN PATENT DOCUMENTS

| | | |
|---|---|---|
| DE | 102006048592 A1 | 4/2008 |
| DE | 102008050643 A1 | 4/2010 |
| DE | 102009035100 A1 | 2/2011 |
| DE | 102009037732 A1 | 2/2011 |
| DE | 102010034915 A1 | 2/2012 |
| EP | 1906462 A2 | 4/2008 |
| WO | 2010023840 A1 | 3/2010 |

* cited by examiner

LIGHT-EMITTING DIODE MODULE AND METHOD FOR OPERATING A LIGHT-EMITTING DIODE MODULE

RELATED APPLICATIONS

The present application is a national stage entry according to 35 U.S.C. §371 of PCT application No.: PCT/EP2012/070388 filed on Oct. 15, 2012, which claims priority from German application No.: 102011085645.5 filed on Nov. 3, 2011, and is incorporated herein by reference in its entirety.

TECHNICAL FIELD

A light-emitting diode module is specified. Furthermore, a method for operating a light-emitting diode module is specified.

SUMMARY

Various embodiments provide a light-emitting diode module and a method for operating the light-emitting diode module, wherein a color rendering index of a radiation generated by the light-emitting diode module does not change or scarcely changes in relation to temperature changes.

In accordance with at least one embodiment of the light-emitting diode module, the latter includes one or a plurality of first light-emitting diode chips. The light-emitting diode chips are, in particular, light-emitting diode chips, LEDs for short, which emit a first radiation in the blue spectral range or in the blue-green spectral range.

In accordance with at least one embodiment, the light-emitting diode module includes one or a plurality of second light-emitting diode chips. The at least one second light-emitting diode chip is designed to emit a second radiation during operation, wherein the second radiation is in the red spectral range or in the orange-red spectral range.

Semiconductor layer sequences of the first and second light-emitting diode chips are preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or else an arsenide compound semiconductor material such as $Al_nIn_{1-n-m}Ga_mAs$, wherein in each case $0 \le n \le 1$, $0 \le m \le 1$ and $n+m \le 1$. In this case, the semiconductor layer sequences may include dopants and additional constituents. For the sake of simplicity, however, only the essential constituents of the crystal lattice of the semiconductor layer sequences, that is to say Al, As, Ga, In, N or P, are indicated, even if these can be replaced and/or supplemented in part by small amounts of further substances. In particular, the first light-emitting diode chip is based on the material system AlInGaN and the second light-emitting diode chip is based on the material system InGaAlP.

The semiconductor layer sequences include at least one active layer designed for generating an electromagnetic radiation. The active layer includes, in particular, at least one pn junction and/or at least one quantum well structure. A radiation generated by the active layer during operation is in particular in the spectral range of between 400 nm and 800 nm inclusive or between 450 nm and 480 nm inclusive and between 600 nm and 660 nm inclusive.

In accordance with at least one embodiment, the light-emitting diode module includes one or a plurality of conversion elements. The conversion element is disposed downstream of exclusively or at least the first light-emitting diode chip and is designed for converting part of the first radiation, which is in the blue spectral range, into a third radiation having wavelengths in the green or green-yellow or green-orange spectral range. If the light-emitting diode module includes a plurality of first light-emitting diode chips, then the conversion element is disposed downstream of at least one of the first light-emitting diode chips, preferably all of the first light-emitting diode chips, or a separate conversion element is assigned to each of the first light-emitting diode chips. Disposed downstream can mean that the conversion element is situated in a beam path of the radiation emitted by the light-emitting diode chip.

In accordance with at least one embodiment, the conversion element includes a first phosphor and a second phosphor. In this case, the first phosphor is designed to emit at a shorter wavelength than the second phosphor. That is to say that a spectrum emitted by the first phosphor leads to a lower dominant wavelength than the spectrum emitted by the second phosphor. In other words, it is possible for both of the phosphors to be jointly disposed downstream of the first light-emitting diode chip.

The dominant wavelength is, in particular, the wavelength which results as the point of intersection of the spectrum locus of the CIE standard chromaticity diagram with a straight line, wherein said straight line, proceeding from the white point in the CIE standard chromaticity diagram, runs through the actual color locus of the radiation. In general, the dominant wavelength differs from a wavelength at which a highest radiation intensity is emitted, the peak wavelength. With regard to an emission wavelength, reference is made hereinafter to the dominant wavelength in each case, unless indicated otherwise.

In accordance with at least one embodiment, the first phosphor has an absorption that decreases toward relatively long wavelengths in the long-wave blue spectral range. Furthermore, the second phosphor has an absorption maximum in the middle blue spectral range. In other words, the first phosphor and the second phosphor have different absorption behaviors in the blue spectral range, in which the first radiation lies.

In at least one embodiment of the light-emitting diode module, the latter includes at least one first light-emitting diode chip which is based on the material system AlInGaN and which is designed to emit a first radiation in the blue spectral range. Furthermore, the light-emitting diode module includes at least one second light-emitting diode chip which is based on the material system InGaAlP and which is designed to emit a second radiation in the red spectral range. A conversion element of the light-emitting diode module is disposed downstream of at least the first light-emitting diode chip and is designed for converting part of the first radiation into a third radiation, wherein the third radiation is in the green to green-yellow spectral range. The conversion element includes a first phosphor and a second phosphor, wherein the first phosphor is designed to emit at a shorter wavelength than the second phosphor. The first phosphor has an absorption that decreases toward relatively long wavelengths in the long-wave blue spectral range, and the second phosphor has an absorption maximum in the middle blue spectral range.

A radiation power emitted by a light-emitting diode chip is dependent, in particular, on the temperature of the light-emitting diode chip. An emitted light power as the temperature increases decreases to a greater extent in the case of InGaAlP-based semiconductor chips than in the case of InGaN-based light-emitting diode chips. This leads to a comparatively great dependence of the color locus of the emitted light on the temperature of the light-emitting diode chips. After the light-emitting diode module has been switched on, the time taken to reach a steady-state operating temperature of the light-emitting diode chips and of the surrounding conversion element is, for example, up to 10 minutes or up to 30 minutes. Color locus changes can therefore occur during this period of time.

This color locus change is undesirable in many applications, for example in general lighting or, for instance, in the backlighting of displays.

Moreover, as the temperature increases, an emission wavelength in particular of the AlInGaN-based light-emitting diode chip shifts toward longer wavelengths. By way of example, such a wavelength shift is between 3 nm and 5 nm inclusive, relative to the dominant wavelength and relative to a change in temperature from room temperature toward the operating temperature of approximately 80° C. to approximately 100° C. A shift in the color locus of the light emitted by the light-emitting diode module is initiated as a result of this as well.

In the case of the light-emitting diode module specified, the conversion element includes two different phosphors having a different absorption characteristic in the blue spectral range. If the temperature of the first light-emitting diode chip increases and the emission wavelength thereof shifts toward longer wavelengths, then an increasing proportion of the first radiation is absorbed in the second phosphor, while the relative proportion of first radiation absorbed and converted in the first phosphor decreases. As a result, the second phosphor emits in an intensified fashion and the second radiation emitted by the entire conversion element therefore shifts toward longer wavelengths as the temperature increases. This has the effect, in particular, that a color locus of the radiation emitted overall by the light-emitting diode module does not shift or shifts to a lesser extent.

In the case of conventional conversion media including only one phosphor, which is based in particular on a garnet such as YAG:Ce, an emission wavelength shifts toward shorter wavelengths as the temperature increases. Since an emission of the second light-emitting diode chip, which emits in the red spectral range, also shifts toward longer wavelengths as the temperature increases, a gap between the emission of the second light-emitting diode chip and that of such a conversion medium forms in the total radiation spectrum emitted by the light-emitting diode module. This gap in the emission spectrum leads to a decrease in the color rendering index as the temperature of the light-emitting diode chips and of the conversion medium increases. A temperature-dependent color rendering index is likewise undesirable in many applications.

By virtue of the fact that the conversion element includes the two phosphors, a spectral gap between the second radiation and the third radiation as the temperature increases can be avoided and a temperature-independent color rendering index can be realized.

In accordance with at least one embodiment of the light-emitting diode module, the first phosphor has a dominant emission wavelength that is less than or equal to 570 nm or less than or equal to 566 nm or less than or equal to 562 nm. Furthermore, the second phosphor has a dominant emission wavelength that is greater than or equal to 570 nm or greater than or equal to 572 nm or greater than or equal to 574 nm.

In accordance with at least one embodiment of the light-emitting diode module, the first phosphor has an absorption spectrum in which an absorption decreases between 450 nm and 460 nm inclusive as the wavelength increases. That is to say that the absorption of the first phosphor decreases monotonically or strictly monotonically from 450 nm toward 460 nm.

In accordance with at least one embodiment, the second phosphor has an absorption maximum between 450 nm and 470 nm inclusive, for example at approximately 460 nm. It is therefore possible that in the spectral range in particular between 450 nm and 460 nm inclusive, in which the emission wavelength of the first light-emitting diode chip can lie, an absorption of the first phosphor and an absorption of the second phosphor proceed in opposite directions to one another, that is to say that the absorption of the first phosphor decreases toward longer wavelengths and the absorption of the second phosphor increases toward longer wavelengths.

In accordance with at least one embodiment of the semiconductor component, the phosphors are present in the form of particles. An average diameter of the phosphor particles is then at least 2 µm or at least 3 µm or at least 5 µm, for example. Alternatively or additionally, the average diameter is at most 20 µm or at most 15 µm or at most 40 µm.

In accordance with at least one embodiment of the light-emitting diode module, the conversion element disposed downstream of the first light-emitting diode chip includes a first matrix material and first scattering particles. The first scattering particles are preferably embedded into the first matrix material. A difference in refractive index between the first matrix material and the first scattering particles is smaller at a temperature of 300 K than at a temperature of 380 K or at a temperature of 400 K.

By means of such first scattering particles and such a first matrix material, less scattering is brought about at a temperature of 300 K, that is to say approximately room temperature, than at a steady-state operating temperature, that is to say at approximately 380 K or approximately 400 K. A scattering effect therefore increases as the temperature increases in the indicated temperature range. This has the effect that in the conversion element the first radiation in the blue spectral range covers a greater average path length as the temperature increases, and that an efficiency for the conversion of the first radiation into the second radiation increases. Therefore, proportionally less first radiation then emerges from the light-emitting diode module if the temperature increases.

As the temperature increases, the first radiation shifts toward longer wavelengths, for example by a value of between 2 nm and 5 nm inclusive. Since a maximum sensitivity of the blue color receptor in the human eye is at approximately 450 nm, the color locus of the first radiation shifts into the blue, at least if a wavelength of maximum intensity of the first radiation at room temperature is below 450 nm, as is preferably the case in the present context.

By means of a conversion element fashioned as specified, the proportion of the emitted first radiation can then be reduced and the effect of the shift in the dominant wavelength of the first radiation with temperature can be reduced or compensated for. Alternatively or additionally, a shift in the color locus in the direction of blue can also occur by virtue of a conversion efficiency of the phosphors decreasing as the temperature increases. The shift in the color locus on account of this effect can also at least be reduced by means of the combination of the two phosphors.

In accordance with at least one embodiment of the light-emitting diode module, the first phosphor and the second phosphor are arranged between the first light-emitting diode chip and the first scattering particles. That is to say that, as viewed along an emission direction of the first light-emitting diode chip, the matrix material with the first scattering particles succeeds the two phosphors. In this case, the two phosphors are preferably embedded in a phosphor lamina with a ceramic matrix.

In accordance with at least one embodiment of the light-emitting diode module, the first phosphor and the second phosphor are not mixed with the first scattering particles. That is to say at least the first phosphor and/or the second phosphor are/is present in a manner spatially separated from the first scattering particles.

In accordance with at least one embodiment of the light-emitting diode module, the first phosphor and/or the second phosphor are/is intermixed with the first scattering particles. The intermixing can be homogeneous. It is likewise possible for one of the phosphors or both phosphors to be sedimented, such that a concentration of the phosphors decreases in a direction away from the first light-emitting diode chip, and that a concentration of the first scattering particles increases in a direction away from the first light-emitting diode chip.

In accordance with at least one embodiment of the light-emitting diode module, a scattering body is disposed downstream of the second light-emitting diode chip, which emits in particular in the red spectral range. The scattering body has a greater scattering capability at a temperature of 300 K than at a temperature of 380 K or 400 K. The second radiation is therefore scattered more highly at a temperature of 300 K than at a temperature of 400 K, for example. In particular, the scattering body is transparent at a temperature of approximately 400 K and no longer has any or any significant scattering effect. Such scattering bodies 4 are described in the document DE 10 2010 034 915, the disclosure content of which is hereby incorporated by reference.

By means of such a scattering body, the greater power dependence in the case of temperature changes of the second light-emitting diode chip, in comparison with the first light-emitting diode chip, can be at least partly compensated for. Since the second radiation is scattered more highly at room temperature, the second radiation is also absorbed in an intensified manner at the second light-emitting diode chip, since proportionally more radiation is reflected back into the second light-emitting diode chip. A radiation coupling-out efficiency of the second radiation out of the scattering body therefore increases as the temperature increases.

An alternative possibility for reducing a color locus shift of the radiation emitted by the light-emitting diode module on account of a temperature response of the second light-emitting diode chip consists in an electrical power with which the second light-emitting diode chip is supplied being regulated in a temperature-dependent manner, that is to say in the electrical power of the second light-emitting diode chip being regulated downward at low temperatures. However, such electronic regulation is comparatively complex.

In accordance with at least one embodiment of the light-emitting diode module, the scattering body includes a second matrix material, into which second scattering particles are embedded. A difference in refractive index between the second matrix material and the second scattering particles is larger at a temperature of 300 K than at a temperature of 380 K or 400 K.

In accordance with at least one embodiment, the first matrix material and/or the second matrix material are formed by a silicone, a silicone-epoxy hybrid material or an epoxy. The first matrix material is, in particular, a low refractive index silicone having a refractive index of, for example, 1.41±0.02 at 300 K. The second matrix material is preferably a high refractive index silicone having a refractive index at 300 K of, for example, 1.51±0.02. Therefore, at room temperature the second matrix material preferably has a higher refractive index than the first matrix material.

In accordance with at least one embodiment of the light-emitting diode module, the first and/or the second scattering particles include at least one of the materials mentioned below or consist of one or more of the materials mentioned: a glass, quartz, silicon dioxide, a metal fluoride such as barium fluoride, calcium fluoride or magnesium fluoride. It is not necessary for all the first scattering particles or all the second scattering particles to be formed from the same material composition.

In accordance with at least one embodiment of the light-emitting diode module, the first scattering particles and the second scattering particles are formed from the same material, in particular from silicon dioxide. If the first and the second scattering particles are formed from the same material, then preferably the first matrix material and the second matrix material differ from one another.

In accordance with at least one embodiment of the semiconductor component, a proportion by weight of the first and/or second scattering particles, relative to the first and/or second matrix material or the entire conversion element and/or the entire scattering body, is at least 0.5% or at least 1%. Alternatively or additionally, the proportion by weight is at most 50% or at most 20% or at most 12% or at most 5%.

In accordance with at least one embodiment of the light-emitting diode module, the first and/or the second scattering particles have average diameters of at least 50 nm or of at least 150 nm or of at least 250 nm or of at least 400 nm. Alternatively or additionally, the average diameter is at most 20 µm or at most 12 µm or at most 8 µm or at most 2 µm. It is possible for the first and/or the second scattering particles to have average diameters that deviate from one another, or the same average diameter.

In accordance with at least one embodiment of the light-emitting diode module, the first phosphor is formed from one of the following materials: $Y_3(Al,Ga)_5O_{12}:Ce$, $(Lu,Y)_3(Al,Ga)_5O_{12}:Ce$, $Lu_3(Al,Ga)_5O_{12}:Ce$, an orthosilicate, a nitrido-orthosilicate.

In accordance with at least one embodiment of the light-emitting diode module, the second phosphor is one of the following substances: $Y_3Al_5O_{12}:Ce$, $Y_3(Al,Ga)_5O_{12}:Ce$.

In accordance with at least one embodiment of the light-emitting diode module, the latter is provided for being operated at an average temperature of the light-emitting diode chips and/or of the conversion element of at least 70° C. or of at least 80° C. or of at least 100° C. During the use of the light-emitting diode module as intended, when a warm-up phase is over and a steady operating state has been reached, at least one of the stated temperatures is present at the light-emitting diode chips and/or the conversion element.

In accordance with at least one embodiment of the light-emitting diode module, the latter is designed to emit a mixed radiation including the first radiation, the second radiation and the third radiation. A color rendering index of the mixed radiation is preferably at least 88 or at least 90. The color rendering index is adjustable by means of the choice of materials for the phosphors and also by means of the relative proportions of the first phosphor and of the second phosphor in relation to one another.

In accordance with at least one embodiment of the light-emitting diode module, the color rendering index, with a tolerance of at most 1.5 percentage points or of at most 1.0 percentage points, is constant over a temperature range of 300 K to 400 K inclusive. This can be achieved by means of the combination of the first phosphor with the second phosphor, which have different emission wavelengths and different absorption behaviors.

Furthermore, a method for operating a light-emitting diode module is specified. The method preferably operates a light-emitting diode module as specified in conjunction with one or more of the embodiments mentioned above. Therefore, features of the method are also disclosed for the light-emitting diode module, and vice versa.

In at least one embodiment of the method, proceeding from 300 K, a temperature of the light-emitting diode chips and/or of the conversion element increases after the light-emitting diode module has been switched on. This increase in temperature results in a shift in the dominant wavelength of the first radiation and/or of the second radiation by a value of 2 nm and 8 nm inclusive toward longer wavelengths. As a result of the increase in temperature, a proportion of the first radiation which is converted in the second phosphor increases, and a proportion of the first radiation which is converted in the first phosphor decreases. Furthermore, the third radiation, which is composed of the first radiation converted by the first phosphor and by the second phosphor, shifts toward longer wavelengths upon an increase in temperature.

In accordance with at least one embodiment of the method, an average propagation distance of the first radiation in the conversion element increases as the temperature increases, proceeding from 300 K toward 380 K or toward 400 K. A proportion of the first radiation which is converted into the third radiation increases overall as the temperature increases.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
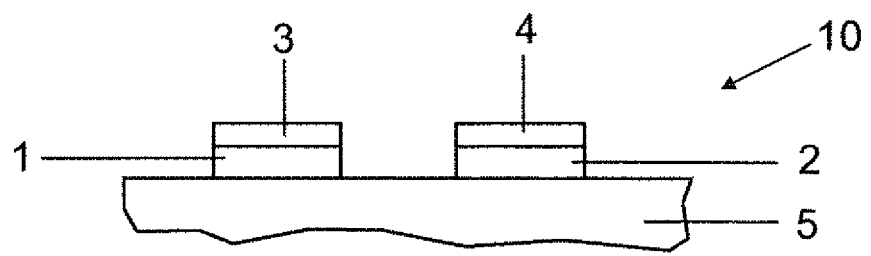
FIGS. 1 to 4 show schematic sectional illustrations of embodiments of light-emitting diode modules described here.

FIG. 1 illustrates one embodiment of a light-emitting diode module 10. A first light-emitting diode chip 1 and a second light-emitting diode chip 2 are fitted on a carrier 5. The first light-emitting diode chip is based on AlInGaN and emits a radiation in the blue spectral range. The second light-emitting diode chip 2 is based on AlInGaP and emits a radiation in the red spectral range.

A conversion element 3 is disposed downstream of the first light-emitting diode chip 1 along an emission direction. The conversion element 3 includes a first phosphor and a second phosphor, which are embedded into a first matrix material. The phosphors differ in terms of their absorption characteristic in the blue spectral range and in terms of their emission characteristic in the green to green-yellow spectral range, also cf. FIGS. 5A to 5C. The phosphors therefore absorb part of the first radiation and convert it into a third radiation.

A scattering body 4 is optionally disposed downstream of the second light-emitting diode chip 2. The scattering body 4 includes a second matrix material and second scattering particles, which are embedded into the second matrix material. As the temperature increases, proceeding from room temperature, a difference in refractive index between the second scattering particles and the second matrix material decreases. At a steady-state operating temperature of the light-emitting diode module 10, the scattering body 4 preferably has a non-scattering effect, unlike at room temperature, approximately 300 K.

The two phosphors in the conversion element 3 make it possible to reduce a temperature dependence of a color locus of a light emitted by the light-emitting diode module 10, and likewise a temperature response of a color rendering index of the light emitted by the light-emitting diode module 10.

Figure 2:
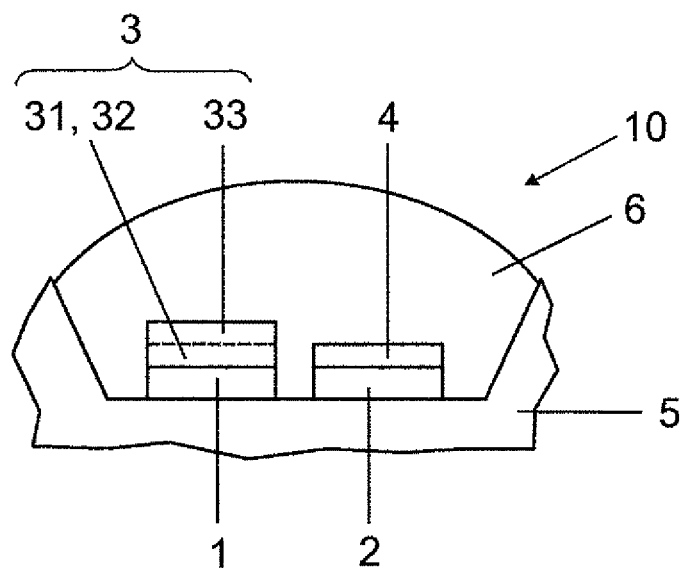

A further exemplary embodiment of the light-emitting diode module 10 is shown in FIG. 2. The light-emitting diode chips 1, 2 are fitted in a cutout in the carrier 5. As also in the other figures, bonding wires, electrical contact areas and conductor tracks are not depicted.

First scattering particles 33 are additionally introduced into the conversion element 3. At room temperature, a difference in refractive index between the first matrix material and the first scattering particles 33 is comparatively small. The difference in refractive index increases toward a steady-state operating temperature, proceeding from room temperature. A scattering effect of the first scattering particles 33 therefore increases, toward the steady-state operating temperature of, for example, approximately 400 K. As a result, at relatively high temperatures, it is possible to achieve an increased efficiency for the conversion of the blue radiation emitted by the first light-emitting diode chip 1 into green light or into green-yellow light.

Layers of a connecting means, which preferably has a thickness of at most 20 µm, can in each case be situated between the first light-emitting diode chip 1 and the second phosphor 32 or else between the ply including the phosphors 31, 32 and the ply including the first scattering particles 33. Preferably, the phosphors 31, 32 and the scattering particles 33 are arranged one directly on top of another.

The second light-emitting diode chip 2 is optionally provided with the scattering body 4. It is furthermore optionally possible for a potting 6 to surround the light-emitting diode chips 1, 2. The potting 6 can be formed by a transparent material or include admixtures in the form of diffusers or filter means. The potting 6, in the same way also as the scattering body 4 and/or the conversion element 3, can be shaped in a lens-like fashion.

Figure 3:
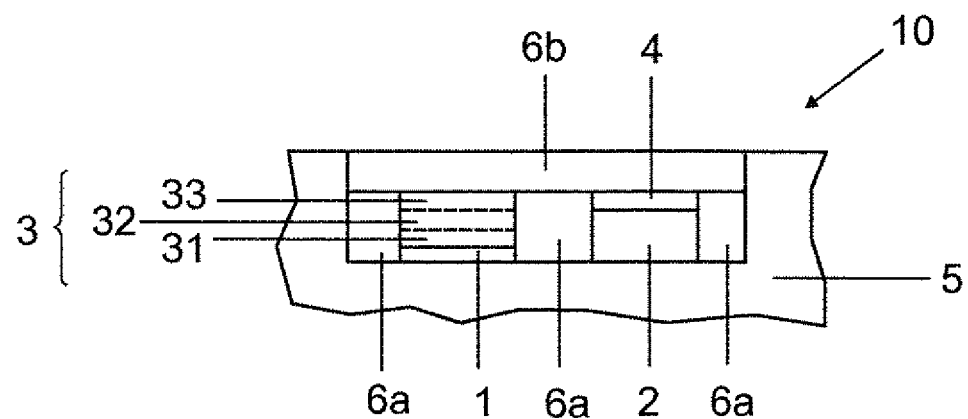

FIG. 3 shows a further embodiment of the light-emitting diode module 10. In the conversion element 3, the phosphors 31, 32 are present as layers separated from one another. A layer including the first scattering particles 33 is situated at a side of the conversion element 3 which faces away from the first light-emitting diode chip 1.

In accordance with FIG. 3, the two light-emitting diode chips 1, 2 are situated in the cutout in the carrier 5. The cutout is optionally filled with a first potting 6a and/or with a second potting 6b. The first potting 6a can be a reflective, in particular white, material. By way of example, the first potting 6a is formed by a silicone matrix admixed with white, reflective titanium dioxide particles. The second potting 6b can be a clear, transparent potting that completely fills the cutout in the carrier 5. It is possible for a side of the conversion element 3 and also of the scattering body 4 facing away from the semiconductor chips 1, 2 to lie in one plane. A top side of the first potting 6a facing away from the carrier 5 can likewise extend as far as said plane.

Figure 4:
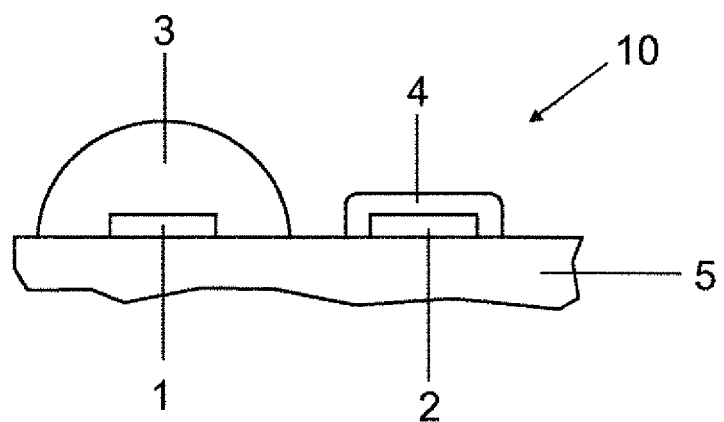

In the case of the exemplary embodiment in accordance with FIG. 4, the conversion element 3 is disposed downstream of the first light-emitting diode chip 1 in a lens-shaped fashion. The phosphors and the first scattering particles can be present in each case in a homogeneously distributed and intermixed manner in the conversion element 3. The optional scattering body 4 is disposed downstream of the second light-emitting diode chip 2 in a hood-like fashion. The conversion element 3 and the scattering body 4 can therefore surround the semiconductor chips 1, 2 in a lateral direction as well.

Figure 5A:
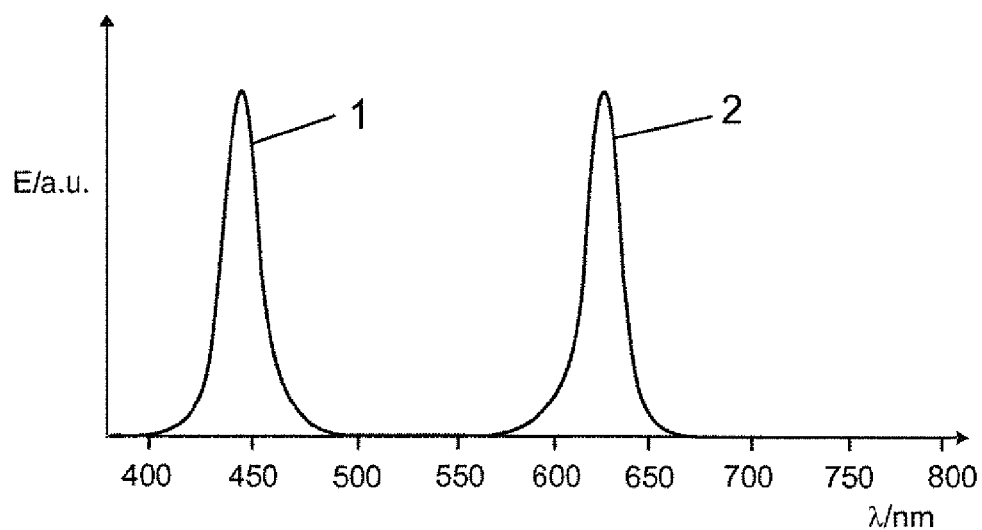
FIGS. 5A to 5C show schematic illustrations of spectra.
Figure 5B:
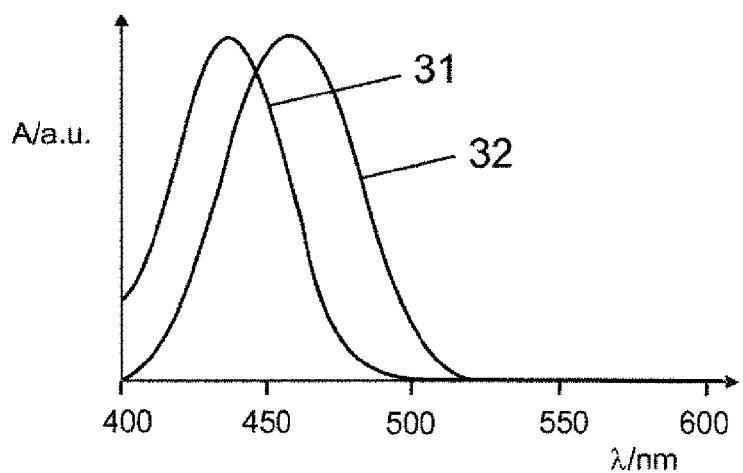
Figure 5C:
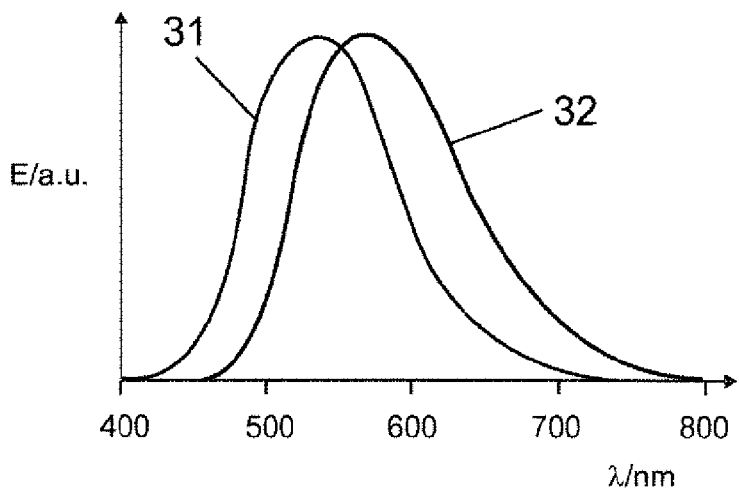

FIGS. 5A to 5C show emission spectra and absorption spectra of the semiconductor chips 1, 2 and of the phosphors 31, 32.

The absorption A and the emission E are plotted in each case in arbitrary units, or a.u. for short. The spectra shown are not respectively normalized or scaled relative to one another.

FIG. 5A illustrates an exemplary emission spectrum of the first light-emitting diode chip 1 and of the second light-emitting diode chip 2. The first light-emitting diode chip 1 has a maximum emission at approximately 440 nm. A maximum emission of the second light-emitting diode chip 2 is approximately 625 nm. The associated dominant wavelengths are not depicted.

FIG. 5B shows the absorption spectra of the first phosphor 31 and of the second phosphor 32 in the blue to blue-green spectral range. The second phosphor 32 has an absorption maximum at approximately 460 nm. Proceeding from the absorption maximum, in the direction toward shorter wavelengths, the absorption decreases in a specific wavelength range. The absorption of the first phosphor 31, by contrast, decreases continuously in this spectral range, in the direction toward longer wavelengths. An absorption maximum of the first phosphor is approximately 440 nm.

Exemplary emission spectra of the phosphors 31, 32 are illustrated in FIG. 5C. The first phosphor 31 emits at shorter wavelengths than the second phosphor 32.

Figure 6A:
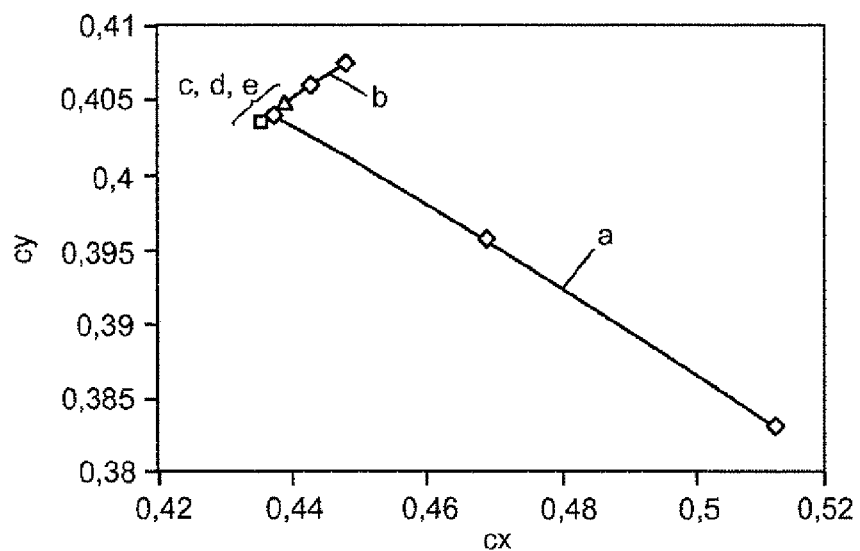
FIGS. 6A to 6C show schematic illustrations of a profile of the color rendering index, of the relative power and of the color locus in the case of temperature changes.
Figure 6B:
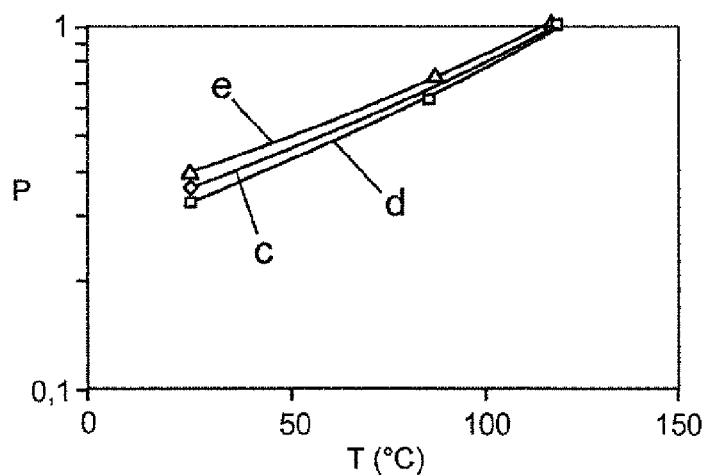
Figure 6C:
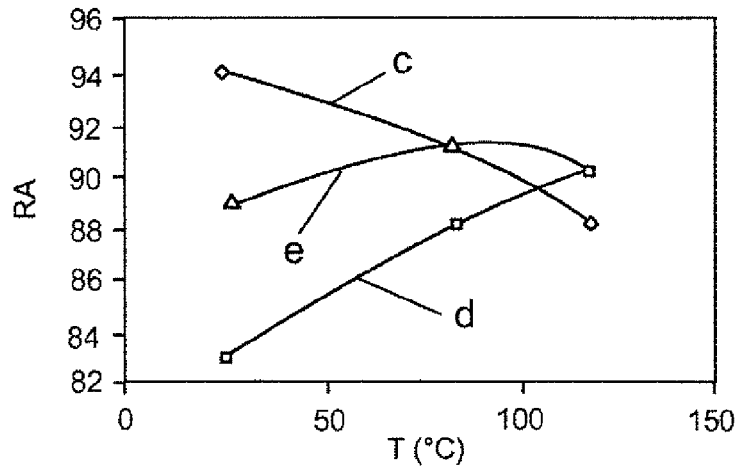

FIGS. 6A to 6C illustrate emission properties as a function of the temperature of different conversion media and conversion elements 3, in each case for temperatures of 120° C., 85° C. and 25° C.

The curve designated by a relates to a conversion medium which includes a YAG phosphor that emits in the green spectral range, without further measures for color locus control. Curve b relates to a conversion medium without scattering particles, in the case of which a YAG phosphor that emits in the green spectral range is disposed downstream of a first light-emitting diode chip, which emits in the blue spectral range, and in the case of which an emission of a second light-emitting diode chip, which emits in the red spectral range, is readjusted electronically, for example.

The curves identified by c relate to conversion media which include a YAG phosphor that emits in the green spectral range, and in the case of which the conversion medium includes first scattering particles and in the case of which a scattering body 4 is disposed downstream of a second light-emitting diode chip. The curves identified by d correspond to a conversion medium such as in the curves c, except that a YAG phosphor that emits in the yellow to green-yellow spectral range is used.

The curves e show a conversion element 3 according to the present disclosure in combination with a scattering body 4 according to the present disclosure. For the curves e, the conversion element 3 therefore includes the first phosphor 31, as used in the curves c, and additionally the second phosphor 32, which emits in the green-yellow spectral range and which was also used in the curves d, and the first scattering particles 33.

It can be seen in FIG. 6A that, at a steady-state operating temperature of approximately 120° C., a color locus lies in each case on the Planckian locus in the CIE standard chromaticity diagram at a color temperature of approximately 3000 K, at color locus coordinates of approximately 0.438 and 0.404. In the case of the curves a, b, the color locus changes appreciably toward lower temperatures and shifts in each case in the direction of red. Only a comparatively small change in the color locus can be ascertained for the curves c, d, e.

FIG. 6B illustrates the regulation requirement of the second light-emitting diode chip 2, which emits in the red spectral range, under the condition that a color locus of the radiation emitted overall by the light-emitting diode module 10 in the temperature range of between 25° C. and 120° C. inclusive is intended to remain within three so-called MacAdams ellipses. The relative power P indicates what light power should be emitted by the second light-emitting diode chip as a function of the temperature, in order that the color locus of the radiation emitted by the light-emitting diode module 10 does not shift significantly. It is therefore necessary to reduce the second light-emitting diode chip 2, which emits in the red spectral range, at a temperature of 25° C., to approximately 35% to 40% of its actual light power. The light power can be reduced by electronic readjustment and/or by the scattering body 4.

The regulation requirement is the lowest in the case of the conversion element 3 according to the present disclosure including the two phosphors 31, 32, see curve e. As a result, in particular in the case where a scattering body 4 is used, an efficiency of the light-emitting diode module 10 increases overall, since a lower regulation requirement means a lower scattering intensity of the scattering body 4 at lower temperatures and absorption losses of the second radiation at the second light-emitting diode chip 2 can be reduced as a result. Moreover, a scattering body 4 having a lower scattering capability at room temperature is easier to realize.

In FIG. 6C, the color rendering index RA is plotted as a function of the temperature T. In the case of the curves c, d, for each of which only one phosphor is present in a conversion medium, the color rendering index changes to a comparatively great extent as a function of the temperature. In the case of the conversion element 3 according to the present disclosure, see curve e, in which the two phosphors are present in a mixed fashion, the color rendering index is constant with a tolerance of 1 percentage point across the temperature range illustrated.

The first phosphor 31 that was used in connection with FIGS. 6A to 6C is, for example, $Lu_3(Al,Ga)_5O_{12}$:Ce having an absorption maximum at approximately 435 nm and having a dominant emission wavelength of approximately 559 nm. The second phosphor 32 is, in particular, a YAG:Ce garnet having an absorption maximum at approximately 460 nm and a dominant emission wavelength of approximately 573 nm. The first scattering particles are silicon dioxide beads having an average diameter of approximately 7 μm.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A light-emitting diode module comprising:
   at least one first light-emitting diode chip which is based on the material system AlInGaN and which is designed to emit a first radiation in the blue spectral range,
   at least one second light-emitting diode chip which is based on the material system InGaAlP and which is designed to emit a second radiation in the red spectral range, and
   a conversion element, which is disposed downstream of at least the first light-emitting diode chip and is designed for converting part of the first radiation into a third radiation in the green to green-yellow spectral range, wherein
      the conversion element comprises a first phosphor and a second phosphor, the first phosphor is designed to emit at a shorter wavelength than the second phosphor,
      the first phosphor has an absorption that decreases toward relatively long wavelengths in the long-wave blue spectral range, and
      the second phosphor has an absorption maximum in the middle blue spectral range,
   wherein a scattering body is disposed downstream of the second light-emitting diode chip, wherein the scattering body has a greater scattering capability at a temperature of 300 K than at a temperature of 400 K.

2. The light-emitting diode module as claimed in claim 1, wherein the first phosphor has a dominant emission wavelength of less than 570 nm and the second phosphor has a dominant emission wavelength of greater than 570 nm, wherein, in the case of the first phosphor, the absorption decreases with increasing wavelength between 450 nm and 460 nm inclusive and, in the case of the second phosphor, the absorption maximum is between 450 nm and 470 nm inclusive.

3. The light-emitting diode module as claimed in claim 1, wherein the conversion element disposed downstream of the first light-emitting diode chip comprises a first matrix material and first scattering particles, wherein a difference in refractive index between the first matrix material and the first scattering particles is smaller at a temperature of 300 K than at a temperature of 400 K.

4. The light-emitting diode module as claimed in claim 3, wherein the phosphors are arranged between the first light-emitting diode chip and the first scattering particles embedded into the first matrix material, wherein the phosphors and the first scattering particles are not intermixed.

5. The light-emitting diode module as claimed in claim 1, wherein the scattering body comprises a second matrix material, which is a silicone or a silicone-epoxy hybrid material, wherein second scattering particles are embedded into the second matrix material, wherein a difference in refractive index between the second matrix material and the second scattering particles is larger at a temperature of 300 K than at a temperature of 400 K.

6. The light-emitting diode module as claimed in claim 3, wherein the first and/or the second scattering particles comprise or consist of at least one of a glass, quartz, silicon dioxide, a metal fluoride.

7. The light-emitting diode module as claimed in claim 1, wherein the first and/or the second scattering particles have average diameters of between 250 nm and 20 μm inclusive.

8. The light-emitting diode module as claimed in claim 1, wherein the first phosphor is a $Y_3(Al,Ga)_5O_{12}$:Ce, a $(Lu,Y)_3(Al,Ga)_5O_{12}$:Ce, a $Lu_3(Al,Ga)_5O_{12}$:Ce, an orthosilicate or a nitrido-orthosilicate.

9. The light-emitting diode module as claimed in claim 1, wherein the second phosphor is a $Y_3Al_5O_{12}$:Ce, or a $Y_3(Al,Ga)_5O_{12}$:Ce.

10. The light-emitting diode module as claimed in claim 1, which is provided for being operated at an average temperature of the light-emitting diode chips and of the conversion element of at least 80° C.

11. The light-emitting diode module as claimed in claim 1, wherein the first and second phosphors are set with regard to their relative proportions in the conversion element such that a color rendering index of at least 88 results from the first, second and third radiations and the color rendering index, with a tolerance of at most 1.5 percentage points, is constant over a temperature range of 300 K to 400 K inclusive.

12. A method for operating a light-emitting diode module, the light-emitting diode module comprising:
   at least one first light-emitting diode chip which is based on the material system AlInGaN and which is designed to emit a first radiation in the blue spectral range,
   at least one second light-emitting diode chip which is based on the material system InGaAlP and which is designed to emit a second radiation in the red spectral range, and
   a conversion element, which is disposed downstream of at least the first light-emitting diode chip and is designed for converting part of the first radiation into a third radiation in the green to green-yellow spectral range, wherein
      the conversion element comprises a first phosphor and a second phosphor, the first phosphor is designed to emit at a shorter wavelength than the second phosphor,
      the first phosphor has an absorption that decreases toward relatively long wavelengths in the long-wave blue spectral range, and
      the second phosphor has an absorption maximum in the middle blue spectral range,
   the method comprising:
      during the operation of the light-emitting diode module, proceeding from 300 K, increasing a temperature of the light-emitting diode chips and, as a result, shifting a dominant wavelength of the first radiation and/or of the second radiation by between 2 nm and 8 nm inclusive toward longer wavelengths, upon an increase in temperature increasing a proportion of the first radiation which is converted into the third radiation in the second phosphor, and decreasing a proportion of the first radiation which is converted into the third radiation in the first phosphor, and
      shifting the third radiation toward longer wavelengths upon an increase in temperature.

13. The method as claimed in claim 12 for operating light-emitting diode module wherein the conversion element disposed downstream of the first light-emitting diode chip comprises a first matrix material and first scattering particles, wherein a difference in refractive index between the first matrix material and the first scattering particles is smaller at a temperature of 300 K than at a temperature of 400 K,
   wherein a scattering of the first radiation at the first scattering particles increases as the temperature increases, and an average propagation distance of the first radiation in the conversion element is thereby increased as the temperature increases,
   wherein a proportion of the first radiation which is converted into the third radiation increases as the temperature increases.

14. The method according to claim 12 for operating the light-emitting diode module wherein the first and/or the second scattering particles comprise or consist of at least one of: a glass, quartz, silicon dioxide, a metal fluoride,
   wherein a scattering of the first radiation at the first scattering particles increases as the temperature increases, and an average propagation distance of the first radiation in the conversion element is thereby increased as the temperature increases,
   wherein a proportion of the first radiation which is converted into the third radiation increases as the temperature increases.

15. The method according to claim 12 for operating the light-emitting diode module wherein the first phosphor is a $Y_3(Al,Ga)_5O_{12}:Ce$, a $(Lu,Y)_3(Al,Ga)_5O_{12}:Ce$, a $Lu_3(Al,Ga)_5O_{12}:Ce$, an orthosilicate or a nitrido-orthosilicate,
   wherein a scattering of the first radiation at the first scattering particles increases as the temperature increases, and an average propagation distance of the first radiation in the conversion element is thereby increased as the temperature increases,
   wherein a proportion of the first radiation which is converted into the third radiation increases as the temperature increases.

16. The method according to claim 12 for operating the light-emitting diode module wherein the second phosphor is a $Y_3Al_5O_{12}:Ce$, or a $Y_3(Al,Ga)_5O_{12}:Ce$,
   wherein a scattering of the first radiation at the first scattering particles increases as the temperature increases, and an average propagation distance of the first radiation in the conversion element is thereby increased as the temperature increases,
   wherein a proportion of the first radiation which is converted into the third radiation increases as the temperature increases.

* * * * *